(12) United States Patent
Chatterjee et al.

(10) Patent No.: US 11,335,632 B2
(45) Date of Patent: May 17, 2022

(54) MAGNETIC INDUCTOR STRUCTURES FOR PACKAGE DEVICES

(71) Applicant: Intel Corporation, Santa Clara, CA (US)

(72) Inventors: Prithwish Chatterjee, Tempe, AZ (US); Junnan Zhao, Gilbert, AZ (US); Sai Vadlamani, Chandler, AZ (US); Ying Wang, Chandler, AZ (US); Rahul Jain, Chandler, AZ (US); Andrew J. Brown, Chandler, AZ (US); Lauren A. Link, Chandler, AZ (US); Cheng Xu, Chandler, AZ (US); Sheng C. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 943 days.

(21) Appl. No.: 15/857,238

(22) Filed: Dec. 28, 2017

(65) Prior Publication Data
US 2019/0206780 A1 Jul. 4, 2019

(51) Int. Cl.
*H01L 27/28* (2006.01)
*H01L 23/498* (2006.01)
(Continued)

(52) U.S. Cl.
CPC ... *H01L 23/49838* (2013.01); *H01F 27/2804* (2013.01); *H01F 41/041* (2013.01);
(Continued)

(58) Field of Classification Search
CPC . H01L 21/4857; H01L 21/4853; H01L 24/19; H01L 23/49822; H01L 23/49838; H01L 24/20; H01L 23/49827; H01L 23/498; H01L 21/486; H01L 23/49811; H01L 23/49866; H01L 2924/00014;
(Continued)

(56) References Cited

U.S. PATENT DOCUMENTS 9,245,835 B1 * 1/2016 Jiang ............... H01L 21/76895
2009/0166804 A1 * 7/2009 Gardner ............ H01L 23/5227
257/531

(Continued)

OTHER PUBLICATIONS

Extended European Search Report for European Patent Application No. 18209004.3, dated May 24, 2019.

(Continued)

*Primary Examiner* — Thanh T Nguyen
(74) *Attorney, Agent, or Firm* — Essential Patents Group, LLP.

(57) ABSTRACT

Methods/structures of forming in-package inductor structures are described. Embodiments include a substrate including a dielectric material, the substrate having a first side and a second side. A conductive trace is located within the dielectric material. A first layer is on a first side of the conductive trace, wherein the first layer comprises an electroplated magnetic material, and wherein a sidewall of the first layer is adjacent the dielectric material. A second layer is on a second side of the conductive trace, wherein the second layer comprises the electroplated magnetic material, and wherein a sidewall of the second layer is adjacent the dielectric material.

15 Claims, 16 Drawing Sheets

(51) Int. Cl.
    H01L 21/48    (2006.01)
    H01F 27/28    (2006.01)
    H01F 41/04    (2006.01)
    H01L 25/16    (2006.01)
    H01L 23/00    (2006.01)

(52) U.S. Cl.
    CPC ........ *H01L 21/486* (2013.01); *H01L 21/4857* (2013.01); *H01L 23/49816* (2013.01); *H01L 23/49822* (2013.01); *H01L 23/49827* (2013.01); *H01L 23/49866* (2013.01); *H01L 25/16* (2013.01); *H01F 2027/2809* (2013.01); *H01L 24/16* (2013.01); *H01L 2224/16235* (2013.01); *H01L 2924/1434* (2013.01); *H01L 2924/19042* (2013.01); *H01L 2924/19102* (2013.01)

(58) Field of Classification Search
    CPC . H01L 2224/81447; H01L 2224/81193; H01L 2224/81815; H01L 2224/16157; H01L 2224/81192; H01L 2224/81191; H01L 2224/131; H01L 2224/16227; H01L 2924/19102; H01L 2924/19042; H01L 24/16; H01L 24/48; H01L 24/81; H01L 2224/48227; H01L 2224/45099; H01L 2924/014; H01L 23/49816; H01L 25/16; H01L 2924/1434; H01L 2224/16235; H01F 41/046; H01F 17/0033; H01F 27/40; H01F 17/0013; H01F 41/043; H01F 27/2804; H01F 2027/2809; H01F 2017/0066; H01F 41/041; H05K 1/00; H05K 1/165; H05K 1/115; H05K 2201/086; H05K 3/4644
    See application file for complete search history.

(56) References Cited

U.S. PATENT DOCUMENTS

| | | |
|---|---|---|
| 2014/0034373 A1 | 2/2014 | Yoshikawa et al. |
| 2014/0102768 A1* | 4/2014 | Shizuno ............... H05K 1/0298 174/251 |
| 2017/0062120 A1 | 3/2017 | Yun et al. |
| 2017/0140862 A1* | 5/2017 | Yun ..................... H01F 27/2804 |
| 2017/0271260 A1* | 9/2017 | Wojnowski ......... H01L 23/5227 |
| 2017/0278780 A1* | 9/2017 | May ....................... H01L 21/486 |

OTHER PUBLICATIONS

Kim, D. et al., "Magnetic properties of nanocrystalline iron group thin film alloys electrodeposited from sulfate and chloride baths", Electrochimica Acta 48.7; 2003; pp. 819-830.

Office Action for European Patent Application No. 18209004.3, dated Feb. 23, 2021.

Office Action for European Patent Application No. 18209004.3, dated Mar. 24, 2022.

* cited by examiner

MAGNETIC INDUCTOR STRUCTURES FOR PACKAGE DEVICES

BACKGROUND

As microelectronic packaging structure design requires ever increasing input out (I/O) density, reduced z-height and reduction in form factor, power delivery requirements become increasingly challenging. Inductor structures coupled with such microelectronic packaging structures can exhibit lower efficiency, which can affect power delivery requirements.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
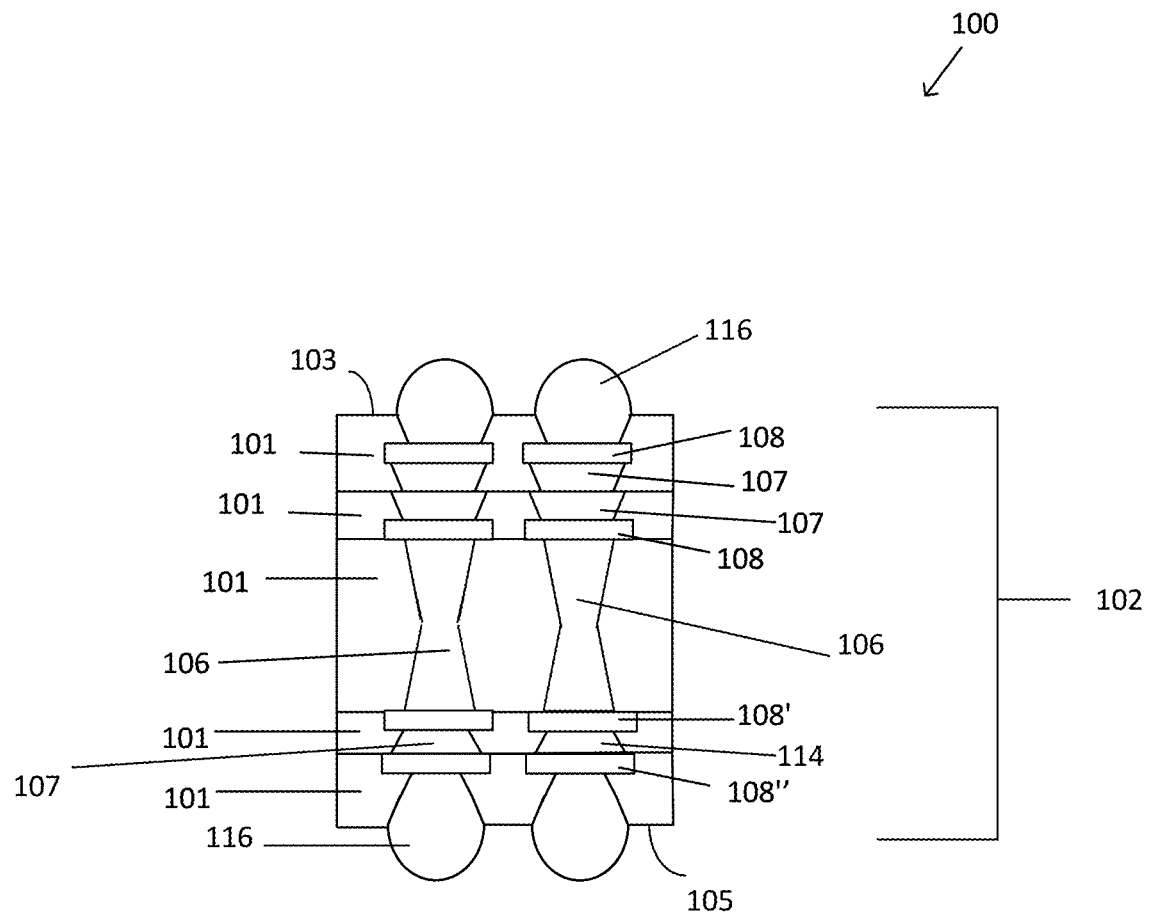
FIG. 1 represents a cross sectional view of a package structure, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Embodiments of methods of forming in-package inductor structures comprising selectively electroplated magnetic material, are described herein. In embodiments, the in-package inductor structures may be formed by incorporating electroplated magnetic alloys that may be selectively formed within the microelectronic package structures. The selectively electroplated magnetic material may be incorporated within both cored and coreless packages. The magnetic material of the in-package inductor structures of the embodiments herein may be selectively electroplated within plated through holes (PTH) of a cored package substrate and may be formed as a via in coreless package structures. Those structures may include a substrate including a dielectric material, the substrate having a first side and a second side. A conductive trace is located within the dielectric material. A first layer is on a first side of the conductive trace, wherein the first layer comprises an electroplated magnetic material, and wherein a sidewall of the first layer is adjacent the dielectric material. A second layer is on a second side of the conductive trace, wherein the second layer comprises the electroplated magnetic material, and wherein a sidewall of the second layer is adjacent the dielectric material.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an microelectronic package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

FIG. 1 is a cross-sectional view of a package structure 100, wherein the package structure 100 includes an in-package inductor structure. The in-package inductor structure includes an electroplated magnetic material that has been selectively formed within the substrate 102 of the package structure 100. The substrate 102 may comprise a portion of a package substrate 102. The substrate 102 may provide structural support for a die/device, in the embodiments, and may comprise a coreless substrate, in an embodiment. By way of example, in one embodiment, the substrate 102 may comprise a multi-layer substrate—including alternating layers of a dielectric/electrically insulating material 101 and conductive interconnect structures 107, 108.

The electrically insulating material may comprise such materials as an epoxy laminate, in an embodiment. For example, the substrate 102 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material.

Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

The substrate 102 may include at least one conductive via structure 106, disposed within dielectric portions 101 of the substrate 102, according to embodiments. The substrate 102 may comprise a coreless package substrate in an embodiment, and may be free of a core structure. Build up layers disposed within the substrate 102 may include conductive interconnect structures 107, 108 which may comprise vias 107, such as microvias, for example, and conductive traces 108 disposed within the dielectric materials 101. The substrate 102 may comprise any number of dielectric layers 101, which may include any number of conductive interconnect structures 107, 108 as appropriate for a particular application. Individual ones of the conductive interconnect structures 107, 108 may comprise traces, trenches, routing layers, ground planes, power planes, re-distribution layers (RDLs), and/or any other appropriate electrical routing features. Although specific patterns of the conductive interconnect structures 107, 108 are illustrated in FIG. 1, such patterns are merely exemplary, and may vary according to the particular application.

A magnetic material 114, that may comprise an electroplated magnetic material, may comprise a portion of an in-package inductor structure. The magnetic material 114 may comprise a portion of an embedded inductor structure, wherein conductive material may be patterned around the magnetic material to form embedded inductor structures of any desired geometry, which will be described further herein. In an embodiment, the magnetic material 110 incorporated in the embedded inductor structure may comprise at least a portion of a power distribution system that may supply power to a die 130 and/or to other components, devices, or systems coupled to the substrate 102/package structure 100. For example, the embedded magnetic inductor of the embodiments herein may form a portion of a voltage regulator coupled to a power supply for a coupled die. Integrating such magnetic inductor structures into the substrate 102 may eliminate the need for an external inductor, in some embodiments.

The magnetic material 114 may be disposed on surfaces of the interconnect structures 107, 108. For example, a magnetic material 114 may be located on conductive structures 108, 108', and may be disposed within the dielectric material 101 of the package substrate 102, and may not be disposed on a first surface 103, nor on a second surface 105 of the substrate 102. That is, the magnetic material 114 may be completely embedded within the substrate 102. The magnetic material 114 may comprise a selectively formed electroplated magnetic material, which may be formed according to particular design requirements in any suitable location/locations within the substrate 102, as will be further described herein. In an embodiment, the magnetic material 114 may be formed on a conductive seed layer, such as on a copper seed layer, for example. The magnetic material 114 may comprise such materials as iron, nickel, cobalt, molybdenum, and combinations thereof. The magnetic material 114 may comprise magnetic materials possessing a high permeability and a low coercivity, and may comprise those materials that are suitable for use as an efficient in-package inductor, to be described further herein.

Figure 2A:
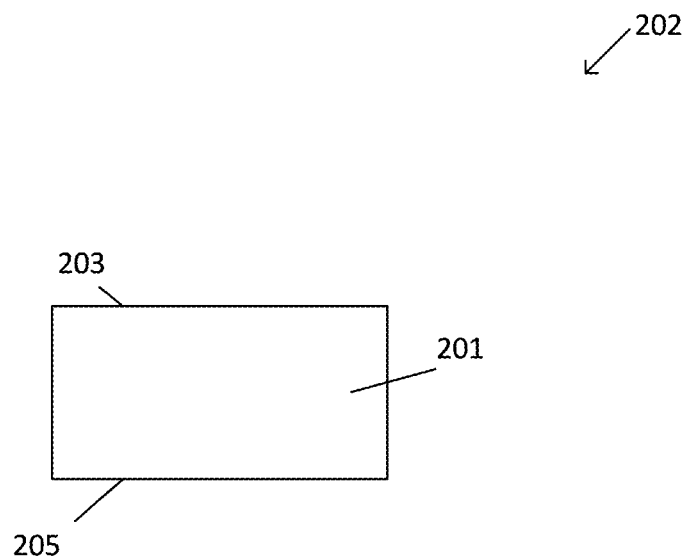
FIGS. 2*a*-2*i* represent cross sectional views of methods of fabricating package structures, in accordance with some embodiments.

FIGS. 2a-2m depict embodiments of forming an in-package magnetic inductor structure, such as the magnetic inductor structure of FIG. 1, for example. FIG. 2a depicts a cross sectional view of a portion of a substrate 202, such as a portion of a package substrate 202. The package substrate 202 may comprise a dielectric material 201, for example, wherein build up layers may subsequently be formed thereon/therein. The package substrate 202 may be a portion of a PCB, an interposer, or the like. In some exemplary embodiments, the package substrate 202 portion may comprise a PCB in a multi-level board including a plurality of conductive trace levels laminated with glass-reinforced epoxy sheets (e.g., FR-4). The portion of the package substrate 202 may comprise a first surface 203 and a second surface 205.

Figure 2B:
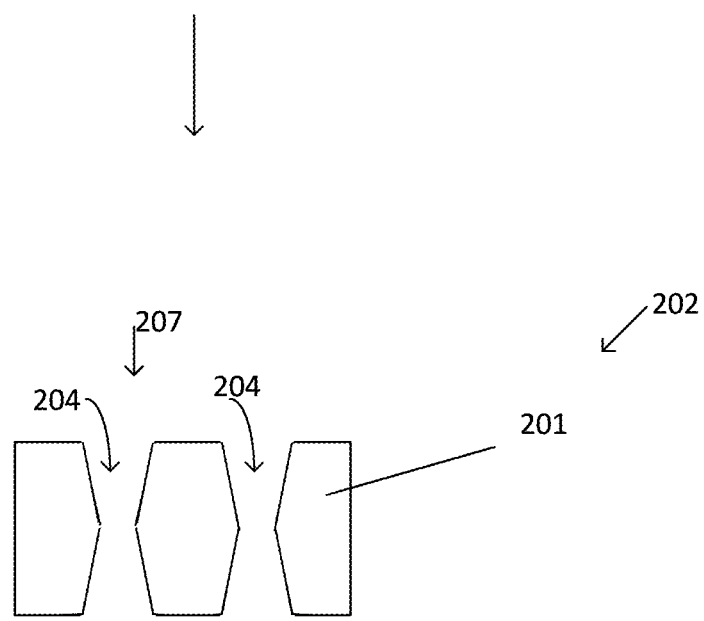
Figure 2C:
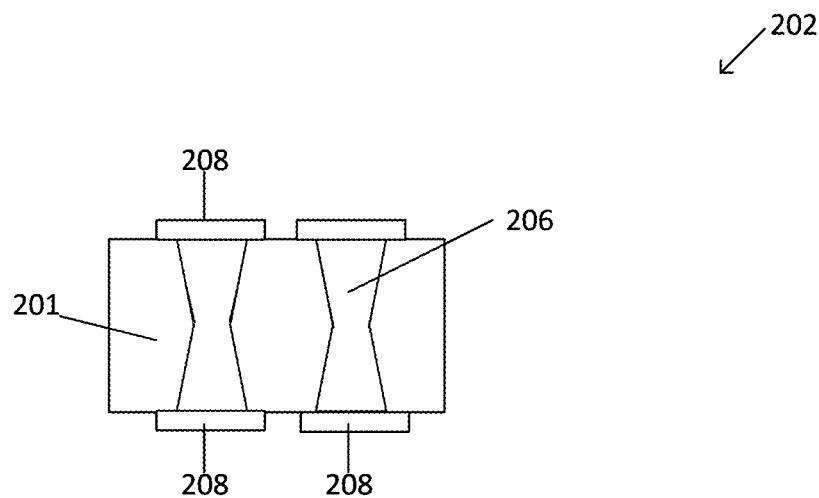

In FIG. 2b, a removal process 207, such as a laser drilling process, for example, may be employed, wherein openings 204 are formed in the substrate 202. In an embodiment, the openings 204 may be formed through the substrate 202, wherein buildup materials may subsequently be formed on a first side 203 of the substrate 202 and/or on a second side 205 of the substrate 202, in an embodiment. In FIG. 2c, a conductive material 206, such as a copper material for example, may be formed within the openings 204 of the substrate portion 202. Interconnect structures 208 comprising conductive material may be formed on terminal end portions of the conductive material 206, wherein the conductive material 206 formed within the openings 204 may comprise conductive via structures, in an embodiment. Dry film resist (DFR) patterning may be utilized to form the conductive structures 208, 206, in an embodiment.

Figure 2D:
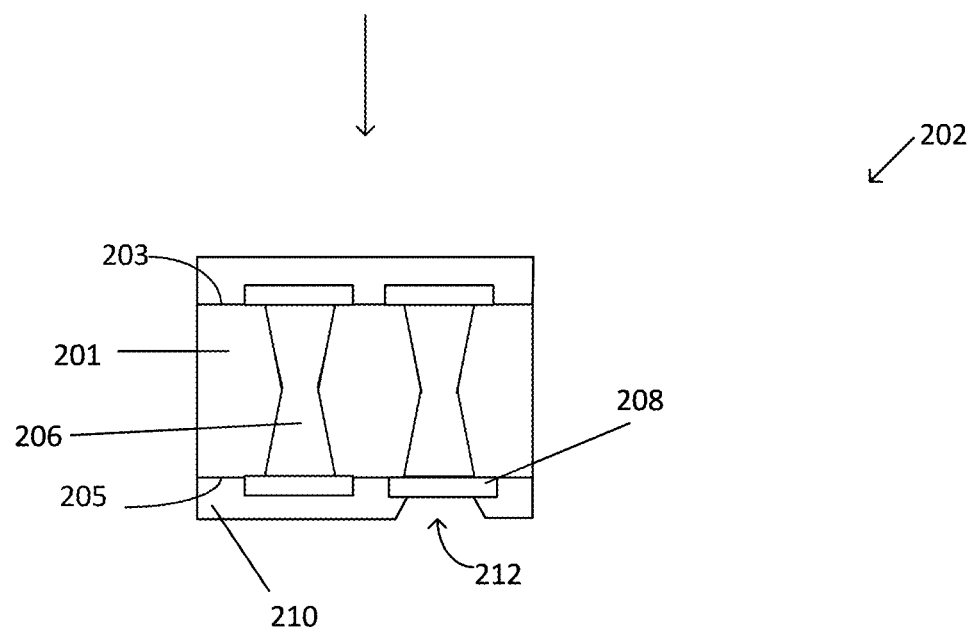

In FIG. 2d, a dielectric material 201, such as any suitable dielectric build up material, for example, may be formed/laminated on the conductive interconnect structures 208 and on the first and second surfaces 203, 205 of the substrate 202. At least one opening 212 may be formed within the dielectric material 210, wherein a surface of the conductive interconnect structure 208 may be exposed. The at least one opening 212 may be formed utilizing a laser drilling and de-smear processing, in an embodiment. The at least one opening may be formed in locations where an in-package inductor is to be formed within the substrate 202.

In an embodiment, a seed layer (not shown) may be formed on the conductive structure 208. The seed layer may comprise a thickness of about 50 nm to about 5 microns, and may be formed by an electroplating process, in an embodiment. In other embodiments, the seed layer may be formed by any suitable formation process, such as by a physical vapor deposition process, for example. The seed layer may comprise such materials as copper, titanium or nickel, and combinations thereof, and may serve to prepare the surface of the conductive structure 208 for the subsequent formation of a magnetic material within the opening 212.

Figure 2E:
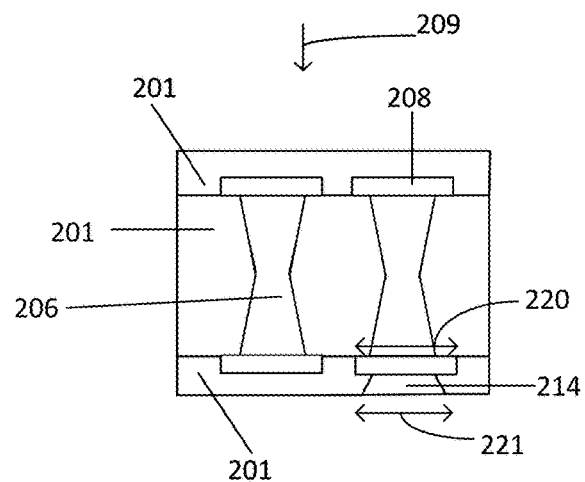

A magnetic material 214 may be formed utilizing an electroplating process 209 on the conductive interconnect structure 208, and within the opening 212 (FIG. 2e). In an embodiment, the magnetic material 214 may be formed on a seed layer (not shown) disposed on a surface of the conductive interconnect structure 208. In an embodiment, a length 220 of the conductive interconnect structure 208 may be greater than a length 221 of the magnetic material formed in the opening 212. In another embodiment, the length 221 of the magnetic material 214 may be less than about 1.5 times the length 220 of the conductive interconnect structure 208.

An electroplating bath utilized in the electroplating process 209 may comprise various chemical constituents. Such constituents/elements as cobalt, nickel, iron, molybdenum and combinations thereof, may be included in the electroplating bath. For example, the bath may comprise various materials such as iron, nickel, and alloys of nickel and iron. In an embodiment, the electroplating bath may comprise a Permalloy (45% nickel and 55 percent iron), and/or a Semipermalloy (79% Ni, 16% Fe and 5% Mo). In an embodiment, the magnetic material 214 formed by using the electroplating process 209 may comprise a hardness factor greater than about 2-3 times the hardness of softer magnetic materials, such as softer iron-silicon magnetic materials, for example. Additionally, the resistivity of the magnetic material produced by the electroplating process 209 may be modulated by varying the ratio of iron to nickel, according to particular design requirements for a specific in-package inductor structure.

In another embodiment, an electroplating bath utilized in the electroplating process 209 may comprise $NiCl_2.6H_2O$, $FeCl_2.4H_2O$, wherein the $Ni^{2+}/Fe^{2+}$ mass ratio may be varied to obtain desired magnetic properties. Stabilizers may be utilized in the electroplating bath, and may include boric acid and a saccharin as stabilizer. The electroplating bath constituents may be optimized to obtain such magnetic alloys/structures as NiFeMo, $Ni_{45}Fe_{55}$ and orthonol $Ni_{50}Fe_{50}$ (Kim, Daheum et al, Magnetic properties of nanocrystalline iron group thin film alloys electroplated from sulfate and chloride baths" electrochmica Actoa 48.7 (2003): 819-830. The electroplating bath may comprise any suitable constituents to form a magnetic material according to inductor design requirements, however some exemplary bath constituents are disclosed herein.

In an embodiment, the electroplating bath may comprise 0.2M $CoCl_2$, 0.7 M NaCl, 0.4 $H_3BO_3$ and 0.0075M saccharine. In another embodiment, the electroplating bath may comprise 0.2M $CoSO_4$+0.7 M $NaSO_4$, 0.4 $H_3BO_3$, and 0.0075M saccharine. In an embodiment, the electroplating bath may comprise 0.2M $CoCl_2$, 0.7 M NaCl, 0.4 $H_3BO_3$, 0.0075M saccharine, and 0.05M L'ascorbic acid. In an embodiment, the electroplating bath may comprise 0.2M $CoSO_4$, 0.7 M $NaSO_4$, 0.4 $H_3BO_3$, 0.0075M saccharine, and 0.05M L'ascorbic acid. In an embodiment, the electroplating bath may comprise 0.2M $NiCl_2$, 0.7 M NaCl, 0.4 $H_3BO_3$ and 0.0075M saccharine. In an embodiment, the electroplating bath may comprise 0.2M $NiSO_4$, 0.7 M $NaSO_4$, 0.4 $H_3BO_3$, and 0.0075M saccharine. In an embodiment, the electroplating bath may comprise 0.2M $FeCl_2$, 0.7 M NaCl, 0.4 $H_3BO_3$, 0.0075M saccharine and 0.05M L'ascorbic acid. In an embodiment, the electroplating bath may comprise 0.2M $FeSO_4$, 0.7 M $NaSO_4$, 0.4 $H_3BO_3$, 0.0075M saccharine and 0.05M L'ascorbic acid.

In an embodiment, the electroplating process may form a cobalt iron magnetic material, and the electroplating bath may comprise 0.2M $CoCl_2$, xM $FeCl_2$, 0.7 M NaCl, 0.4 $H_3BO_3$, 0.0075M saccharine, and 0.05M L'ascorbic acid. In an embodiment, the electroplating bath may comprise 0.2M $CoSO_4$, xM $FeCl_2$, 0.7 M $NaSO_4$, 0.4 $H_3BO_3$, 0.0075M saccharine and 0.05M L'ascorbic acid. In an embodiment, the electroplating process may form a nickel cobalt magnetic material, and the electroplating bath may comprise 0.2M $NiCl_2$, $xMCoCl_2$, 0.7 M NaCl, 0.4 $H_3BO_3$ and 0.0075M saccharine. In an embodiment, the electroplating bath may comprise 0.2M $NiSO_4$ $xMCoCl_2$, 0.7 M $NaSO_4$, 0.4 $H_3BO_3$, and 0.0075M saccharine. In an embodiment, the electroplating process may form a CoNiFe magnetic material, and the electroplating bath may contain 0.2M $NiCl_2$, $0.15MCoCl_2$, yM $FeCl_2$, 0.7 M NaCl, 0.4 $H_3BO_3$, 0.0075M saccharine and 0.05M L'ascorbic acid. In an embodiment, the electroplating process may form a CoNiFe magnetic material, and the electroplating bath may comprise 0.2M $NiSO_4$, $0.15MCoSO_4$, yM $FeSO_4$, $0.15MCoSO_4$, 0.7 M $NaSO_4$, 0.4 $H_3BO_3$, 0.0075M saccharine and 0.05M L'ascorbic acid.

The magnetic material 214 may comprise a low coercivity, and a permeability of greater than about 2 in general, and in some embodiments, may comprise a permeability of between about 2 to about 50. The magnetic material 214 may comprise a thickness of between 10 microns to about 1000 microns in an embodiment, but may vary according to the particular application. The magnetic material 214 may comprise a grain structure according to a particular electroplated magnetic material structure, as distinguished from magnetic paste material, for example, and may be free from fillers and resin, for example. The magnetic material 214 may be patterned after formation by utilizing self-aligned patterning process, for example. By utilizing such patterning and electroplating processes, the magnetic material 214 may be selectively formed within portions/locations of the package substrate 202, according to particular design requirements wherein in-package inductor structures are desired to be located.

Figure 2F:
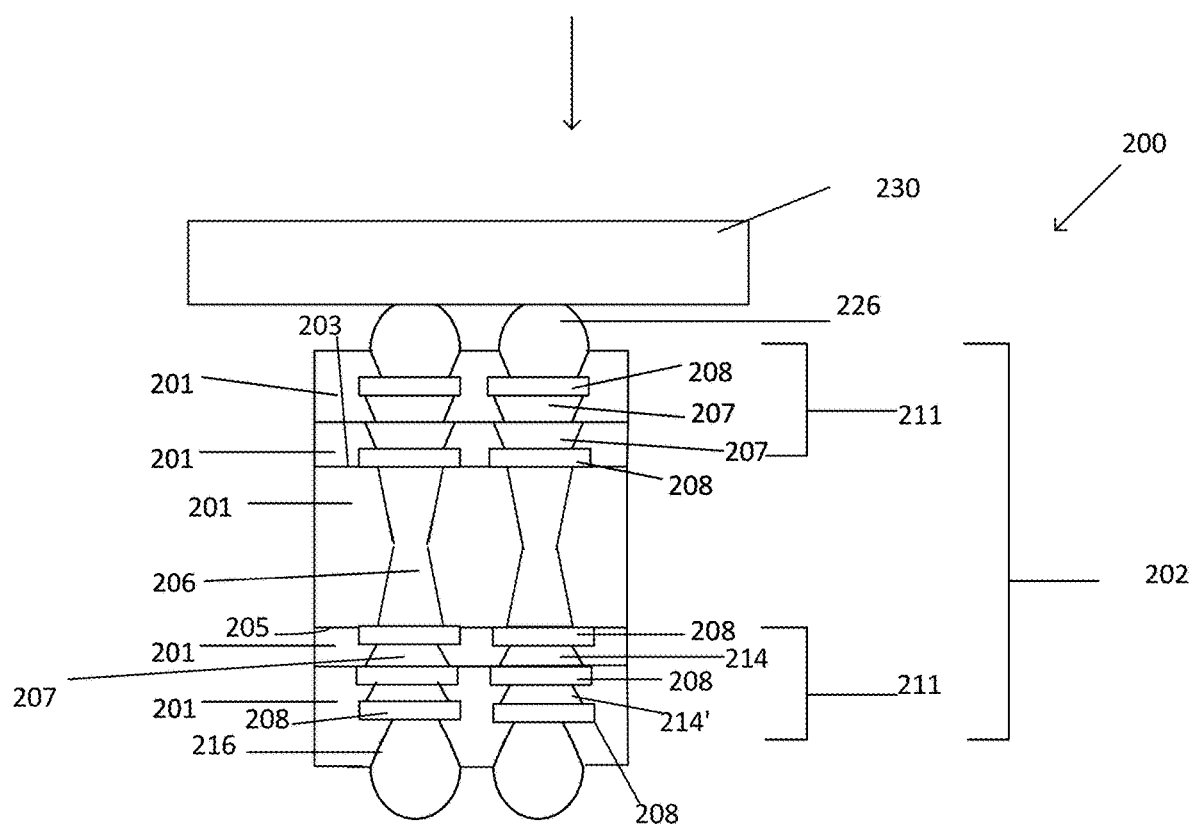

FIG. 2*f* depicts buildup layers 211 that may be formed on the via structures 206, wherein a package structure 200 comprising an in-package inductor, is formed. The in-package inductor may comprise the magnetic material 214 disposed on the conductive interconnect material, and may comprise any suitable geometry such as a serpentine structure a race loop structure, or a magnetic material plated feature wherein a via is encapsulated by dielectric material. The number of levels of conductive traces/metallization levels that may be built up within the package structure 200 may vary according to the particular design requirements. Additional magnetic material 214' may be formed on the conductive interconnect structures 208, and may be patterned according to design requirements. In an embodiment, the magnetic material 214 comprises a first layer on a first side of the conductive trace, wherein a sidewall of the first layer is adjacent the dielectric material 201. The magnetic material 214 may comprise a second layer on a second side of the conductive trace 208, in an embodiment. Solder structures 226 may be formed on a surface/surfaces 203, 205 of the substrate 202. The solder structures may be electrically coupled to a die and/or a PCB/motherboard, in an embodiment. In an embodiment, a die 230, may be electrically and physically coupled to the package substrate 202, and may be coupled with the solder structures 226.

The die/device 230 may comprise any type of integrated circuit device. In one embodiment, the die 230 may include a processing system (either single core or multi-core). For example, the die 230 may comprise a microprocessor, a graphics processor, a signal processor, a network processor, a chipset, etc. In one embodiment, the die 230 may comprise a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of devices/die.

Conductive interconnect structures may be disposed on a side(s) of the die/device 230 (not shown) and may comprise any type of structure and materials capable of providing electrical communication between a die/device and a substrate, or another die/device, for example. In an embodiment, conductive interconnect structures may comprise an electrically conductive terminal on a die (e.g., a pad, bump, stud bump, column, pillar, or other suitable structure or combination of structures) and a corresponding electrically conductive terminal on a substrate (e.g., a pad, bump, stud bump, column, pillar, or other suitable structure or combination of structures). Solder (e.g., in the form of balls or bumps) may be disposed on the terminals of the substrate and/or die/device, and these terminals may then be joined using a solder reflow process. Of course, it should be understood that many other types of interconnects and materials are possible (e.g., wirebonds extending between a die and a substrate).

The terminals on the die 230 may comprise any suitable material or any suitable combination of materials, whether disposed in multiple layers or combined to form one or more alloys and/or one or more intermetallic compounds. For example, the terminals on the die may include copper, aluminum, gold, silver, nickel, titanium, tungsten, as well as any combination of these and/or other metals. In other embodiments, a terminal may comprise one or more non-metallic materials (e.g., a conductive polymer). The terminals on a substrate may also comprise any suitable material or any suitable combination of materials, whether disposed in multiple layers or combined to form one or more alloys and/or one or more intermetallic compounds.

Figure 2G:
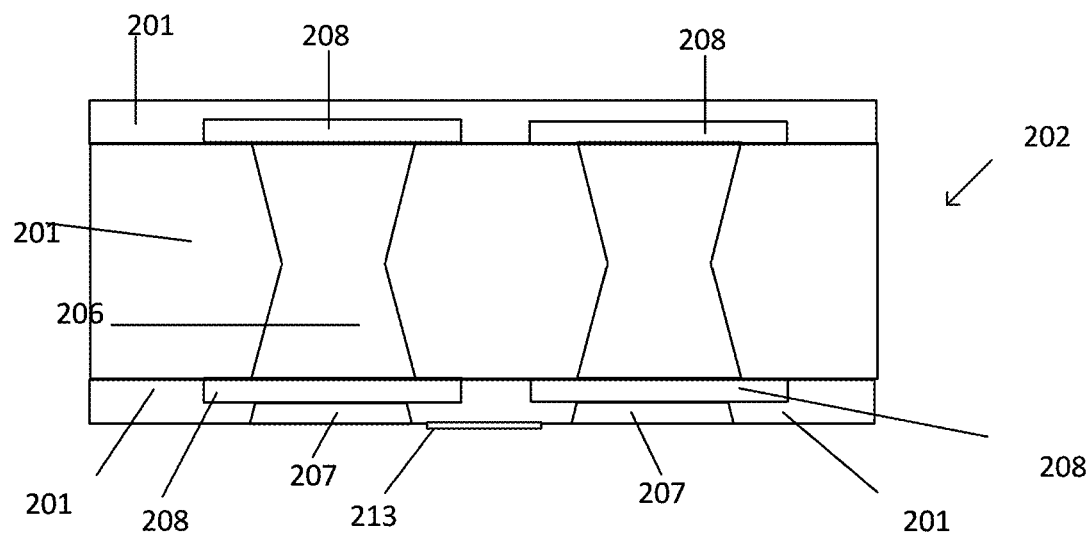
Figure 2H:
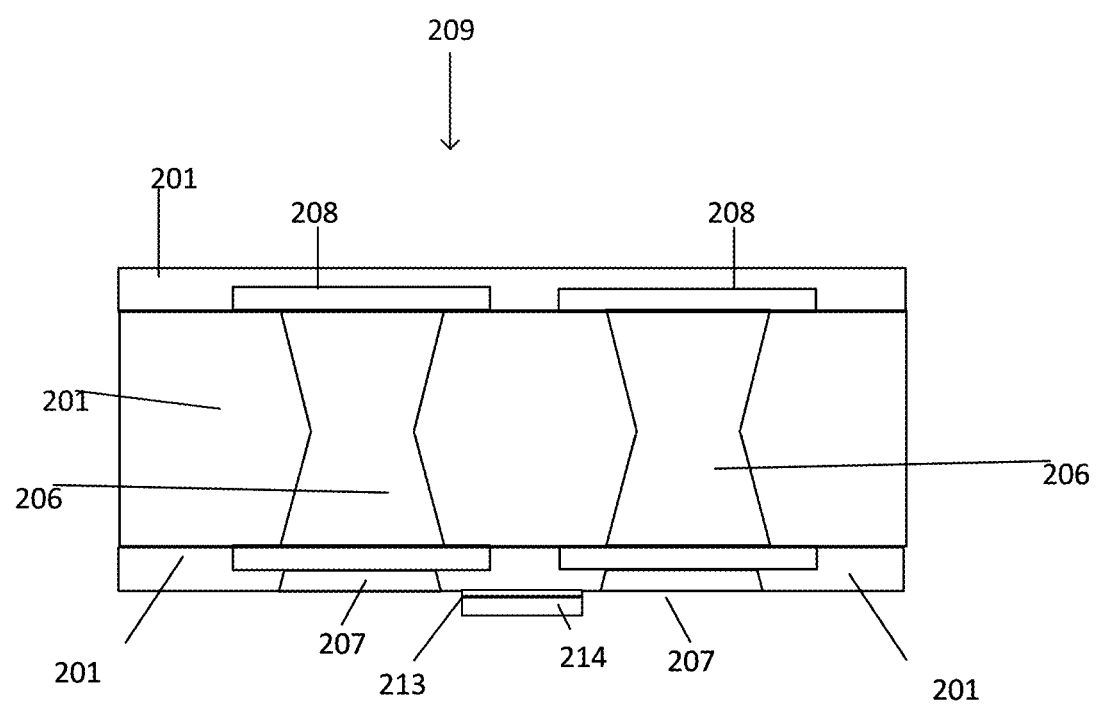

In another embodiment, at least one in-package inductor structure may be formed at a unit/panel level. In FIG. 2*g*, a seed layer 213 may be formed on selected locations of surfaces of a portion of a coreless substrate 202, in an embodiment. The coreless substrate portion 202 may comprise vias 206 disposed in a dielectric material 201, wherein further layers of dielectric material 201 may be formed/laminated on the surfaces of the vias 206. The seed layer 213 may comprise a conductive material, such as a copper material, and may comprise a thickness of about 50 nm to about 5 microns, in an embodiment, and may be formed using any suitable formation process, such as a physical vapor deposition process, or an electroplating process, for example. The seed layer 213 may be formed on selected portions of the dielectric material 201, where an in-package process is to be formed.

Figure 2I:
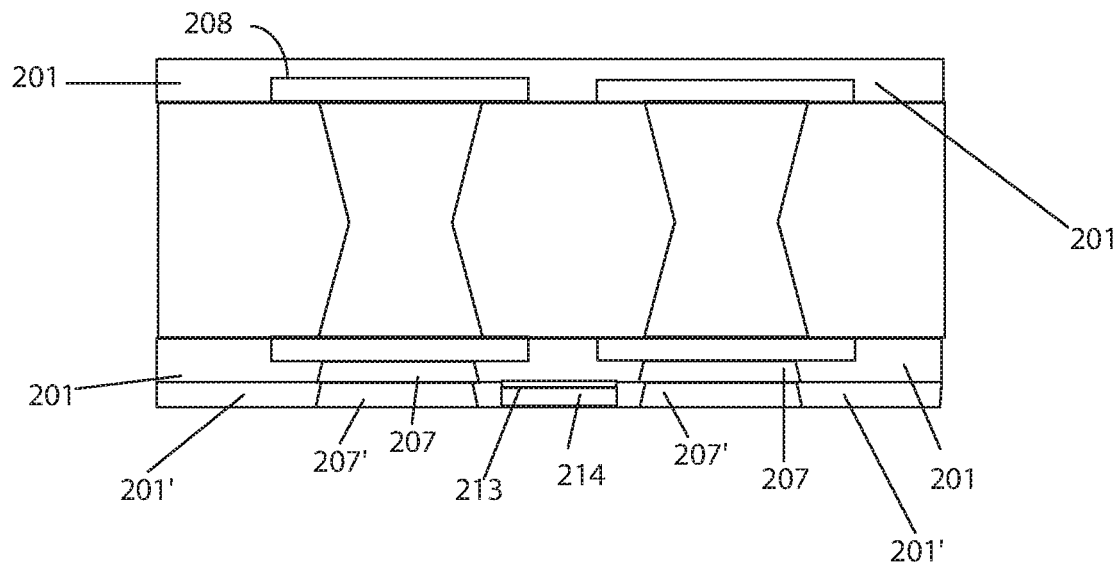
Figure 2J:
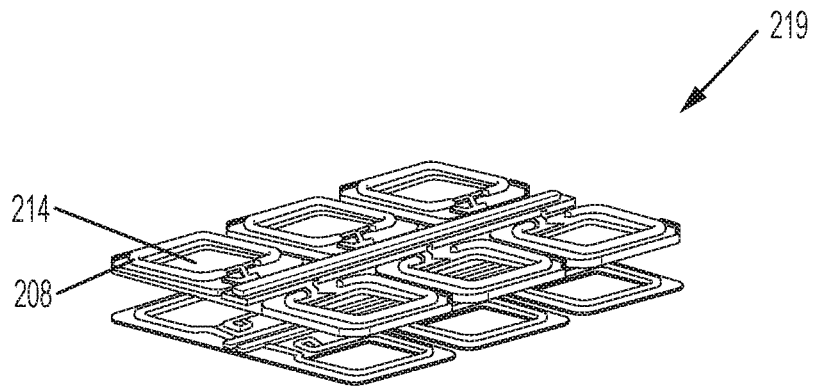
FIG. 2*j* represents a side perspective view of an inductor structure according to embodiments.
Figure 2K:
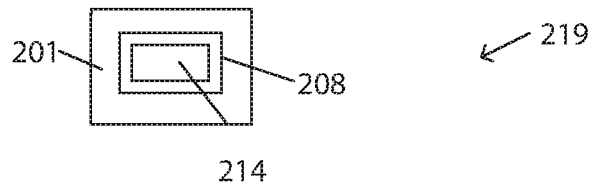
FIG. 2*k* represents a top view of an inductor structure according to embodiments.
Figure 2L:
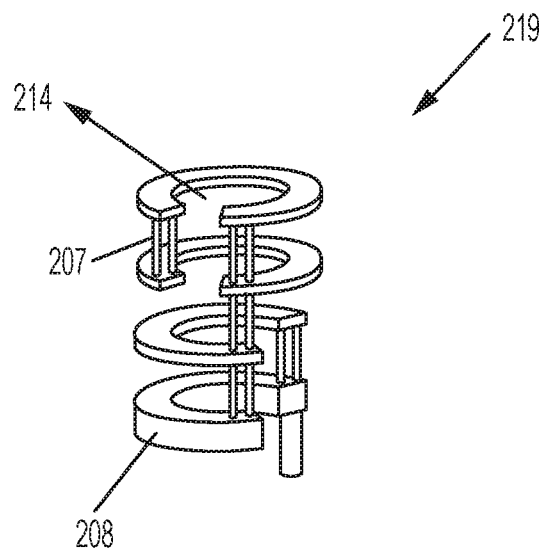
FIG. 2*l* depicts a side perspective view of an inductor structure according to an embodiment.
Figure 2M:
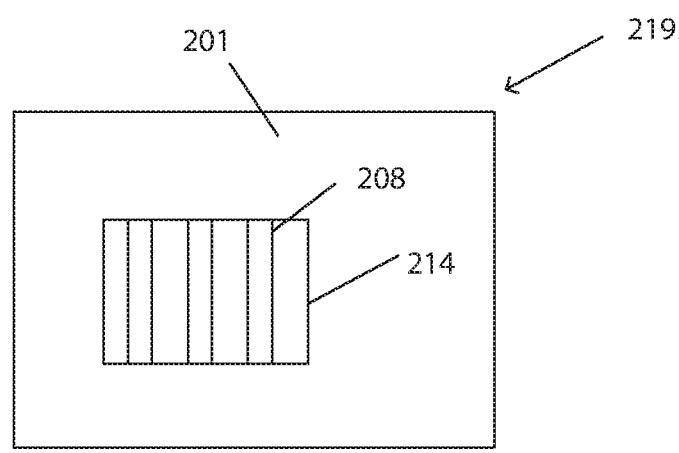
FIG. 2*m* depicts a top view of an inductor structure according to an embodiment.

A magnetic material 214 may be selectively formed on the seed layer 213, and may not be formed on the adjacent dielectric material 201 (FIG. 2*h*), by utilizing the selective electroplating process 209. A dielectric layer 201' may then be formed on the magnetic material 214, and further conductive structures 207' may be formed within the dielectric layer 201', adjacent the magnetic material 214 (FIG. 2*i*). The dielectric material 201 may be ground to planarize with the surfaces of the magnetic material 214 and the additional conductive material 207', in an embodiment. Build up layers (not shown) may be formed on the magnetic material 214. A side perspective view of an in-package, embedded electroplated inductor structure 219 is depicted in FIG. 2*j*, wherein the magnetic material 214 is on the conductive material, such on conductive structure 208, and wherein the dielectric material is adjacent the magnetic material 214. In an embodiment, the conductive material is formed to loop around the magnetic material. A top view of a portion of an in-package/embedded inductor structure 219 is shown in FIG. 2*k*, wherein the magnetic material 214 is on a selected portion of the conductive material 208, and wherein the inductor 219 is disposed within the dielectric material 201 of the substrate 202, such as within the substrate 202 of FIG. 2*h*, for example, and is not disposed on a surface of the substrate 202. FIG. 2*l* depicts another side perspective view of an embedded inductor structure 219, wherein the inductor 219 geometry is in the form of a serpentine-like shape. FIG. 2*m* depicts a top view of another geometry, wherein an embedded inductor 219 comprises rectangular shaped conductive material 208 disposed on the magnetic material 214, wherein the magnetic material 214 is embedded within the dielectric material 201 of the substrate, such as within the dielectric material of a build up layer.

Figure 3A:
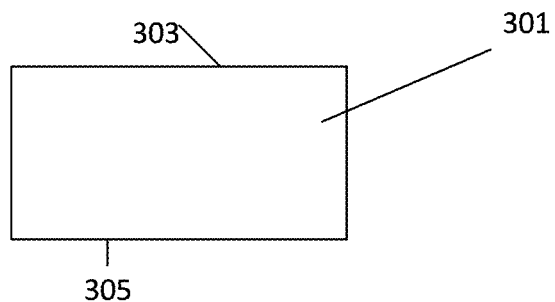
FIGS. 3*a*-3*h* represent cross sectional views of methods of fabricating package structures, in accordance with some embodiments.
Figure 3B:
Figure 3B:
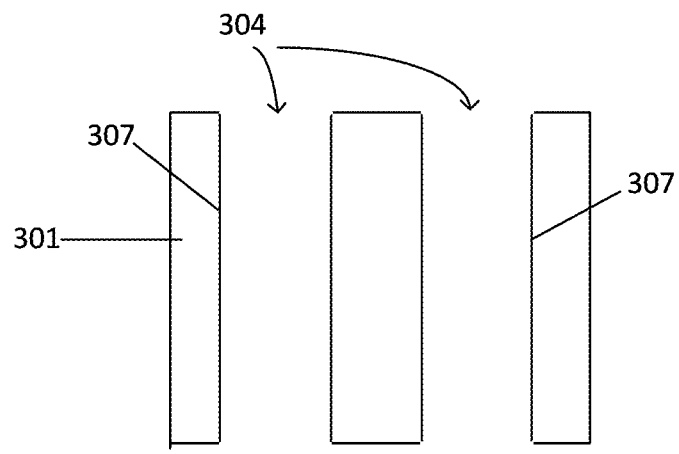

FIGS. 3*a*-3*g* depict another method of forming an in-package inductor on a cored substrate, according to embodiments, by utilizing selective electroplated magnetic materials. In FIG. 3*a*, a portion of a substrate, which may comprise a core portion 301 of a package substrate, may comprise a dielectric material in an embodiment. The core material may comprise an organic material in an embodiment, and may comprise other suitable materials, such as ceramic and/or glass, for example. In an embodiment, the core 301 may comprise a first surface 303 and a second surface 305.

Figure 3C:
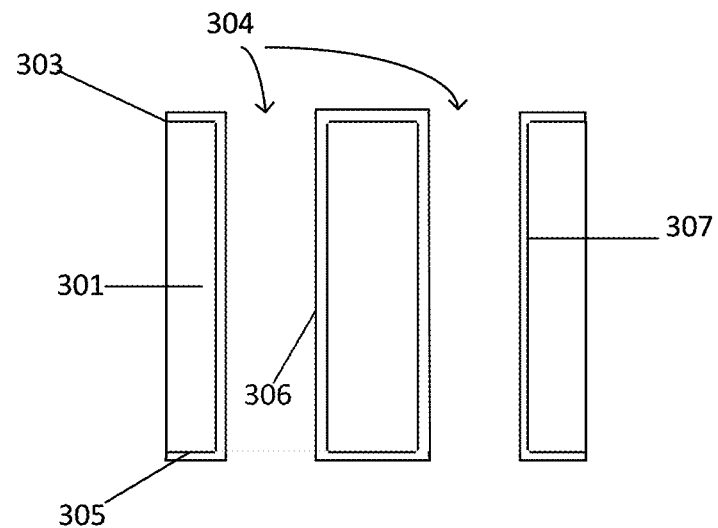

In an embodiment, openings 304, which may comprise openings for the formation of a via structure, such as a plated through hole (PTH), may be formed in the core 301 (FIG. 3*b*), wherein the openings 304 may comprise sidewalls 307. The openings 304 may be formed by a drilling process, such as a laser drilling process, for example. A seed layer 306 may be formed on sidewalls 307 of the openings 304, and on surfaces 303, 305 of the core 301 (FIG. 3*c*). The seed layer 306 may be formed by placing the core 301 in an electroplating bath in an embodiment, but in another embodiment, the seed layer 306 may be formed by such processes as physical vapor deposition, chemical vapor deposition, and any other suitable formation process. The seed layer may comprise a thickness between about x and y.

Figure 3D:
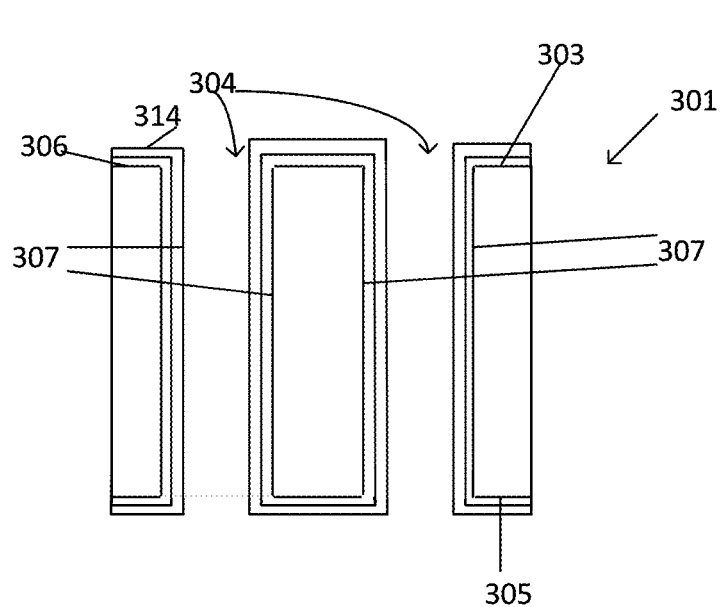

In FIG. 3*d*, a magnetic material 314 may be formed, by a selective electroplating process, onto the surfaces 303, 305 of the core 301, and onto sidewalls 307 of the core 301. The magnetic material 314 is selectively electroplated only where an in-package inductor is to be formed. The magnetic material 314 may comprise similar materials and properties as the magnetic material 114 of FIG. 1, for example. The magnetic material 314 may comprise a thickness of about 10 microns to about 1000 microns, and may comprise a low coercivity and a high permeability, such as comprising a permeability of greater than about 2, for example. In an embodiment, the electroplated magnetic material 314 may be patterned by electroplating in a selected region in the substrate wherein the conductive material may be plated in an inductor area, and may be patterned in a serpentine fashion, for example, in an embodiment. In other cases, the inductor structure may be designed/patterned in such a way that the inductor geometry comprises multiple loops traveling the cross section of the substrate. The patterning of the magnetic material 314 may utilize a dry film resist (DFR) patterning technique, as well as stripping processes, such as flash etching, for example. Magnetic plating thickness can vary based on design requirements and plugin capability, in an embodiment.

Figure 3E:
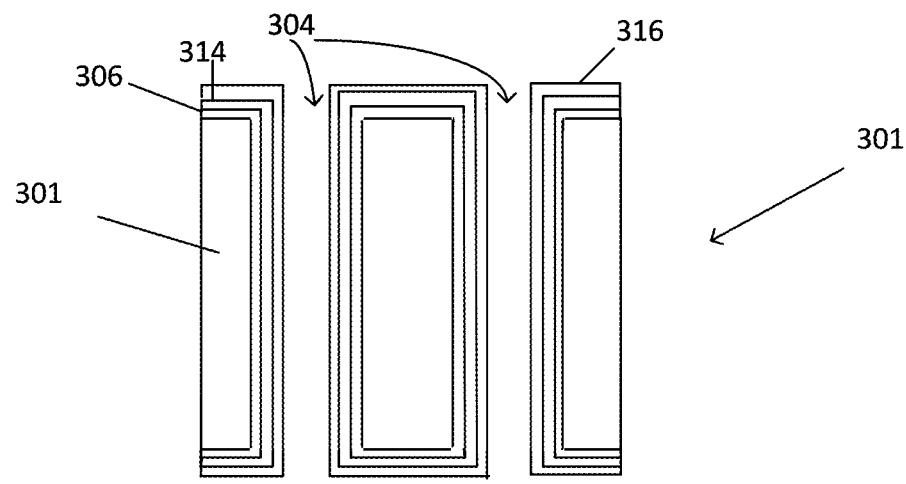
Figure 3F:
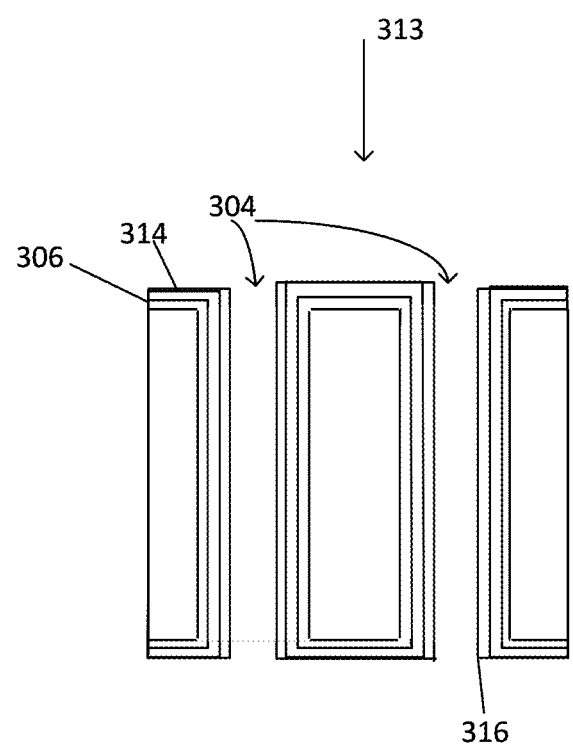
Figure 3G:
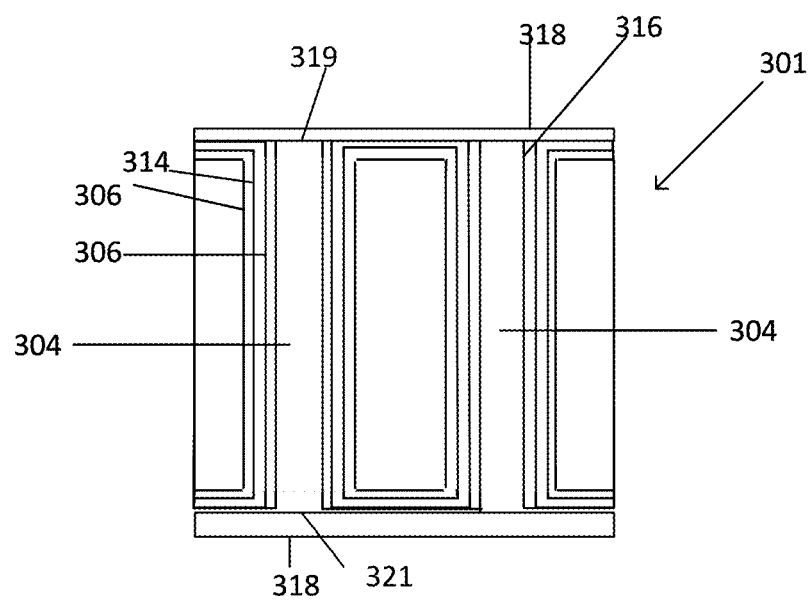
Figure 3H:
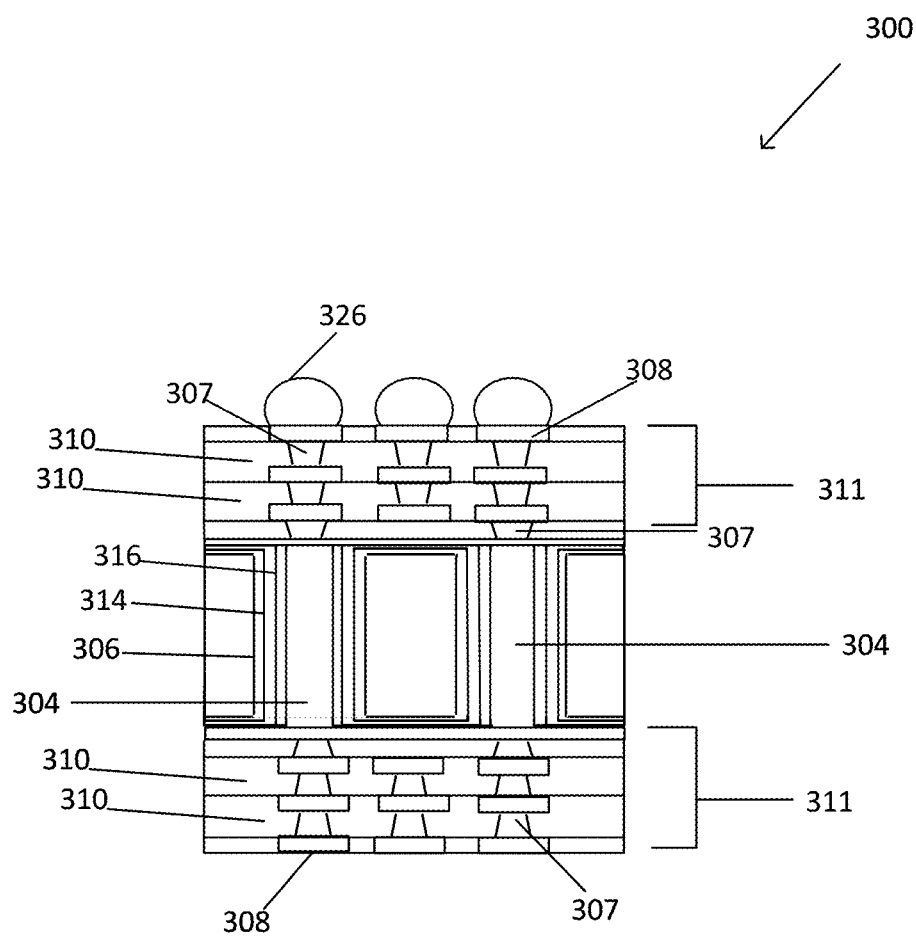
Figure 4A:
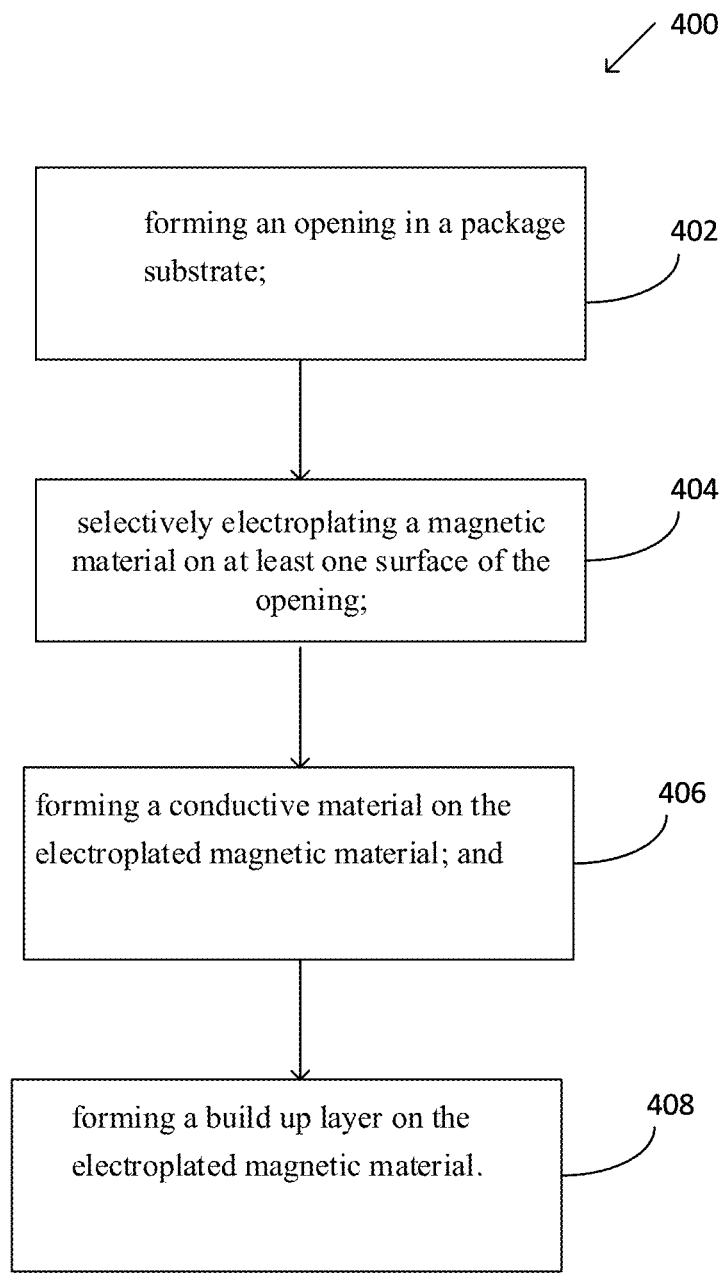
FIGS. 4*a*-4*b* represent methods of forming package structures in accordance with some embodiments.

A conductive material/layer 316 may be formed/plated on the magnetic material 314 (FIG. 3*e*). The conductive material 316 may comprise copper, for example, and may be formed by any suitable formation process, such as a plating process, for example, and may be formed on sidewalls 307 and on surfaces 303, 305 of the core 301. In FIG. 3*f*, the conductive layer 316 may be planarized to expose the magnetic material 314 on the surfaces 303, 305 of the core 301, wherein a plugging and grinding process 313 may be employed. A conductive lid 318, such as a copper lid, may be plated onto the surfaces 303, 305 of the core 301 (FIG. 3*g*). In an embodiment, a first surface 319 and a second surface 321 of the via 304 is free of the magnetic material 314. Build up layers 311 including conductive structures 307, 308 may then be formed on the surfaces 303, 305 of the core 301, and solder balls 326 may be attached to the surfaces of the build-up layers, to form the package structure 300 (FIG. 3*h*). The in-package inductors of the embodiments provide efficient power delivery, and are economical to fabricate. The magnetic material of the in-package inductors described herein are embedded in specific locations in the substrate, by utilizing selective electroplating and patterning processes. The in-package inductors described herein alleviate such issues as biased highly accelerated stress testing and leaching risks. Additionally, the in-package inductor structures herein enable superior, high efficiency package fabrication FIG. 4*a* depicts a method 400 of forming an in-package inductor structure, wherein a magnetic material is selectively electroplated to form a portion of the in-package inductor structure. At operation 402, an opening is formed in a package substrate. The opening may comprise a plated through hole in a cored package substrate, or in the case of a coreless package, may comprise an opening in a dielectric layer of the coreless package substrate. The opening may expose a conductive interconnect structure, such as a conductive pad, for example. At operation 404, a magnetic material is selectively formed on at least one surface of the opening. The magnetic material may further be formed on a surface of the conductive interconnect structure. In an embodiment, a seed layer may initially be formed within the opening, and may also be formed on the conductive interconnect structure.

The seed layer may comprise any suitable conductive material with which to subsequently form a magnetic material. By selecting the locations of the openings and/or the seed layer formation, magnetic material layers of an inductor structure may be placed at desired locations within a package substrate. The magnetic material may comprise a thickness of between 10 microns to about 1 mm, in an embodiment, but may vary according to the particular application. The magnetic material may comprise materials that possess a low coercivity and a high permeability, such as nickel, iron, molybdenum, cobalt and combinations/alloys thereof. In an embodiment, a length of the conductive interconnect structure may be greater than a length of the magnetic material formed in the opening. In another embodiment, a length of the magnetic material may be less than about 1.5 times a length of the conductive interconnect structure 208.

At operation 406, a conductive material may be formed on the magnetic material. The conductive material may comprise a copper material, for example. The inductor structure thus formed may be patterned in any suitable geometry within the package substrate. At step 408, at least one build-up layer and/or dielectric layer may be formed on the inductor structure, so that the in-package inductor structure may be fully embedded within the package substrate.

Figure 4B:
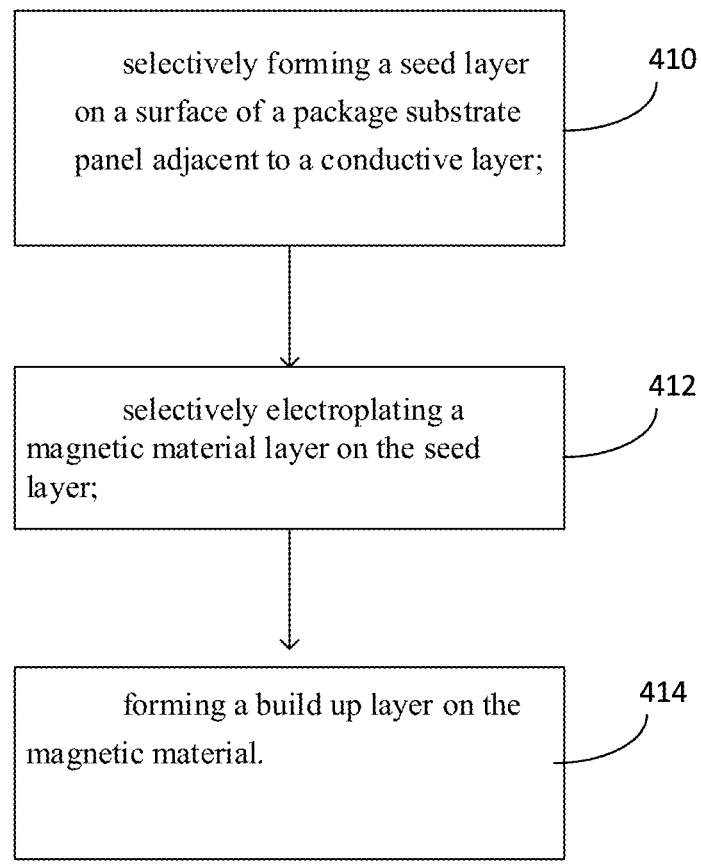

FIG. 4*b* depicts a method of forming an in-package inductor structure, wherein a magnetic material is selectively electroplated at a unit/panel level to form portions of at least one in-package inductor structure. At operation 410, a seed layer may be selectively formed on a surface of a package substrate panel, wherein the seed layer is formed adjacent to a conductive layer. The conductive layer may be disposed within a dielectric material within the substrate. The substrate panel may comprise an array of substrates prior to a singulation process, in an embodiment. The seed layer may be formed and patterned utilizing any suitable formation and patterning techniques. The seed layer may be formed in locations in which in-package inductor structures may be located.

At operation 412, a magnetic material may be selectively electroplated on the seed layer, such that the magnetic material is only formed where the seed layer is disposed. The magnetic material may be electroplated according to the embodiments described herein, and may comprise a low coercivity and a high permeability magnetic material. The magnetic material may comprise such materials as nickel, cobalt, iron, molybdenum, and combinations thereof. At operation 414, a build-up layer may be formed on the magnetic material.

The package structures of the embodiments herein may be coupled with any suitable type of structures capable of providing electrical communications between a microelectronic device, such as a die, disposed in package structures, and a next-level component to which the package structures herein may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments, the structures may further comprise a plurality of dies, which may be stacked upon one another, depending upon the particular embodiment. In an embodiment, a die(s) may be partially or fully embedded in a package structure of the embodiments herein.

The various embodiments of the device/package structures included herein may be used for system on a chip (SOC) products, and may find application in such devices as smart phones, notebooks, tablets, wearable devices and other electronic mobile devices. In various implementations, the package structures herein may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 5:
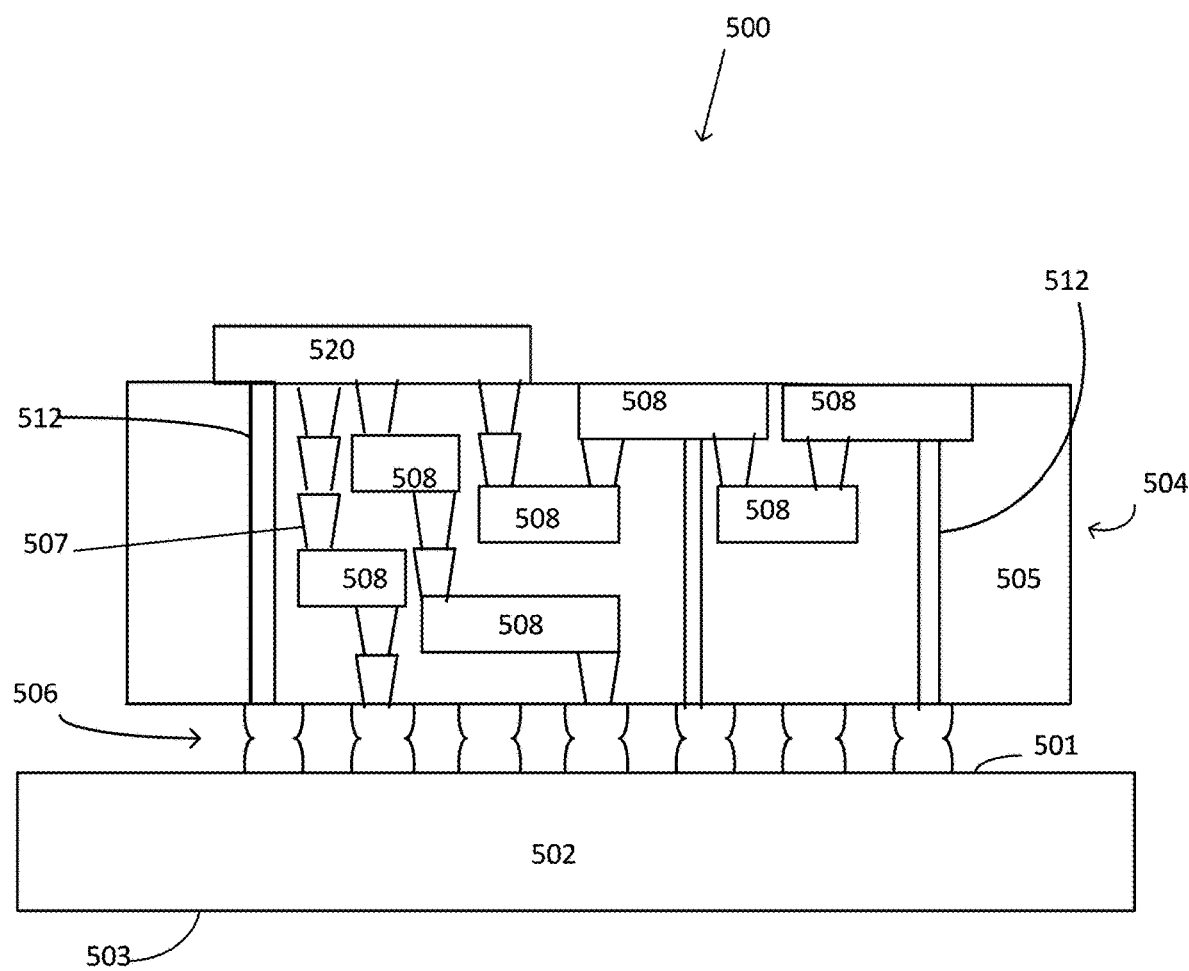
FIG. 5 represents a cross-sectional view of a computing system in accordance with embodiments.

Turning now to FIG. 5, illustrated is a cross sectional view of an embodiment of a computing system 500. The system 500 includes a mainboard 502 or other circuit board. Mainboard 502 includes a first side 501 and an opposing second side 503, and various components may be disposed on either one or both of the first and second sides 501, 503. In the illustrated embodiment, the computing system 500 includes at least one die 520, disposed on a surface (such as on a top or bottom or side surface) of a substrate 504, such as a package substrate comprising at least one of the embedded inductor structures according to any of the various embodiments herein. The substrate 504 may comprise an interposer 504, for example, or any other type of substrate, such as a cored substrate or a coreless substrate, for example.

The substrate 504 may comprise various conductive layers 508, for example, which may be electrically and physically connected to each other by via structures 507. The conductive layers 508 may comprise conductive traces in an embodiment.

The substrate 504 may further comprise through substrate vias 512, which may comprise the magnetic material on sidewalls, such as in FIG. 3g, for example. Dielectric material 505 may separate/isolate conductive layers from each other within the substrate 504. Joint structures 506 may electrically and physically couple the substrate 504 to the board 502. The computing system 500 may comprise any of the embodiments of the in-package, embedded inductor structures described herein.

System 500 may comprise any type of computing system, such as, for example, a hand-held or mobile computing device (e.g., a cell phone, a smart phone, a mobile internet device, a music player, a tablet computer, a laptop computer, a net top computer, etc.). However, the disclosed embodiments are not limited to hand-held and other mobile computing devices and these embodiments may find application in other types of computing systems, such as desk-top computers and servers.

Mainboard 502 may comprise any suitable type of circuit board or other substrate capable of providing electrical communication between one or more of the various components disposed on the board. In one embodiment, for example, the mainboard 502 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 501. However, it should be understood that the disclosed embodiments are not limited to the above-described PCB and, further, that mainboard 502 may comprise any other suitable substrate.

Figure 6:
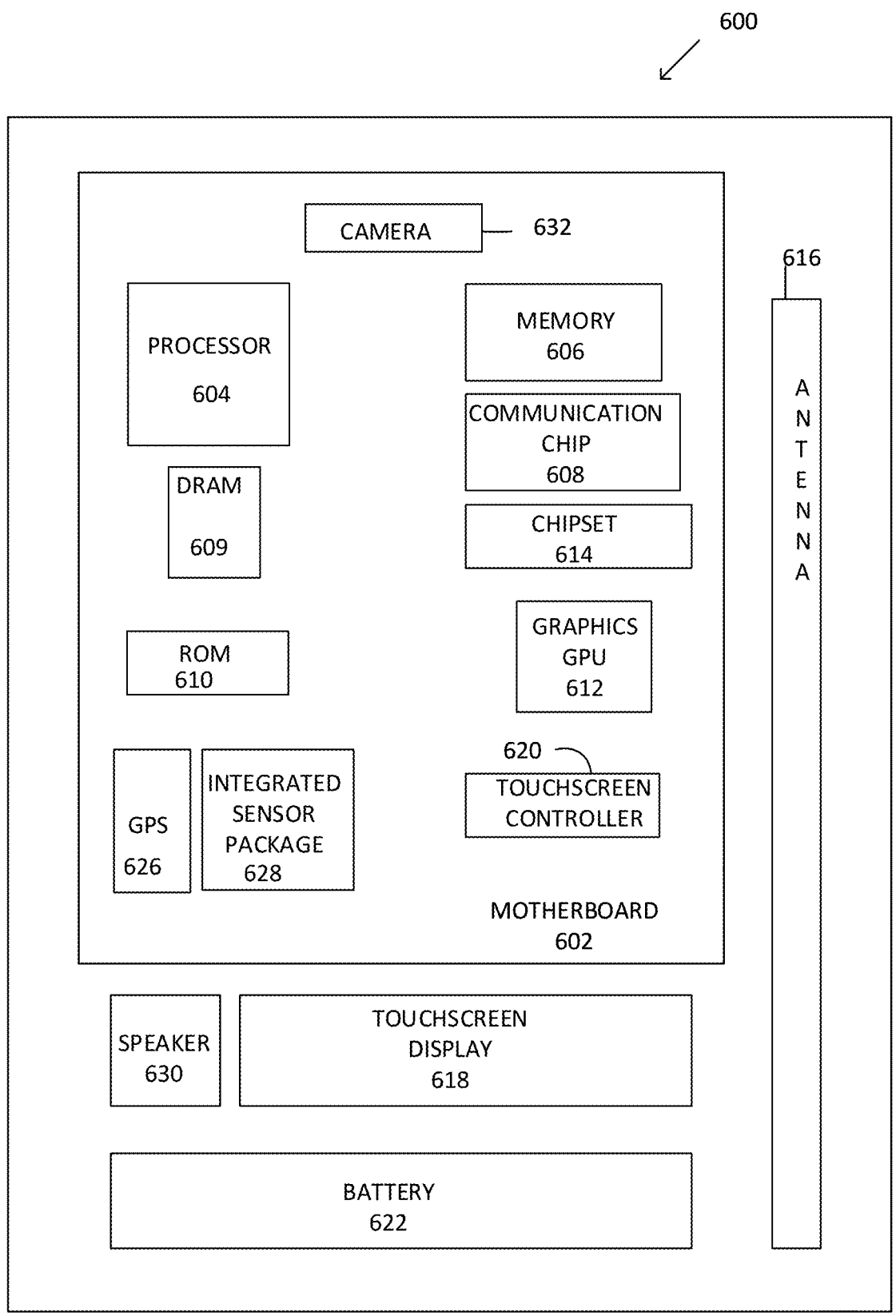
FIG. 6 represents a schematic of a computing system in accordance with embodiments.

FIG. 6 is a schematic of a computing device 600 that may be implemented incorporating embodiments of the package structures described herein. For example, any suitable ones of the components of the computing device 600 may include, or be included in, package structures comprising the in-package inductor structures of the various embodiments disclosed herein. In an embodiment, the computing device 600 houses a board 602, such as a motherboard 602 for example. The board 602 may include a number of components, including but not limited to a processor 604, an on-die memory 606, and at least one communication chip 608. The processor 604 may be physically and electrically coupled to the board 602. In some implementations the at least one communication chip 608 may be physically and electrically coupled to the board 602. In further implementations, the communication chip 608 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 609, non-volatile memory (e.g., ROM) 610, flash memory (not shown), a graphics processor unit (GPU) 612, a chipset 614, an antenna 616, a display 618 such as a touchscreen display, a touchscreen controller 620, a battery 622, an audio codec (not shown), a video codec (not shown), a global positioning system (GPS) device 626, an integrated sensor 628, a speaker 630, a camera 632, an amplifier (not shown), compact disk (CD) (not shown), digital versatile disk (DVD) (not shown), and so forth. These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example, the above embodiments may include specific combinations of features as further provided below.

Example 1 is a microelectronic package structure, comprising: a substrate including a dielectric material, the substrate having a first side and a second side; a conductive trace located within the dielectric material; a first layer on a first side of the conductive trace, wherein the first layer comprises a magnetic material, and wherein a sidewall of the first layer is adjacent the dielectric material; and a second layer on a second side of the conductive trace, wherein the second layer comprises the magnetic material, and wherein a sidewall of the second layer is adjacent the dielectric material.

Example 2 includes the microelectronic package structure of example 1, wherein a seed layer is between the first layer and the conductive trace, wherein the seed layer comprises one or more of copper, titanium, nickel, and alloys thereof.

Example 3 includes the microelectronic package structure of example 2, wherein the seed layer comprises a thickness of between about 50 nm to about 5 microns.

Example 4 includes the microelectronic package structure of any one of the preceding examples, wherein the second layer is between the conductive trace and a solder ball, wherein the solder ball is at least partially on one of the first or the second surfaces of the substrate.

Example 5 includes the microelectronic package structure of any one of the preceding examples, wherein the substrate comprises a portion of a coreless package, and wherein a dielectric layer is on the second layer, and wherein a length of the second layer is less than a length of the conductive trace.

Example 6 includes the microelectronic package structure as in of any one of the preceding examples, wherein the magnetic material comprises a portion of an embedded inductor structure.

Example 7 includes the microelectronic package structure as in of any one of the preceding examples, wherein the magnetic material comprises one or more of iron, nickel, cobalt or molybdenum, their alloys, and combinations thereof.

Example 8 includes the microelectronic package structure as in of any one of the preceding examples, wherein the first side of the substrate includes a die electrically coupled thereto.

Example 9 includes the microelectronic package structure as in of any one of the preceding examples, wherein the substrate comprises a printed circuit board (PCB), and the die comprises a memory die.

Example 10 is a microelectronic package structure comprising: a substrate; a core located within the substrate, wherein the core includes a first side and a second side; a via extending through at least a portion of the core; a magnetic material on a sidewall of the via;

and a conductive material on the magnetic material.

Example 11 includes the microelectronic package structure of example 10, wherein the magnetic material comprises an electroplated magnetic material, wherein the electroplated magnetic material comprises one or more of iron, nickel, cobalt, molybdenum, and combinations thereof.

Example 12 includes the microelectronic package structure as in any one of the preceding examples wherein a seed layer is between the via sidewall and the magnetic material, and wherein the magnetic material is an electroplated magnetic material.

Example 13 includes the microelectronic package structure as in any one of the preceding examples wherein at least a portion of one of the first surface or the second surface of the core comprises the magnetic material adjacent the via.

Example 14 includes the microelectronic package structure as in any one of the preceding examples, wherein the magnetic material comprises a thickness of between about 10 microns and about 30 microns.

Example 15 includes the microelectronic package structure as in any one of the preceding examples, wherein a first surface and a second surface of the via is free of the magnetic material.

Example 16 includes the microelectronic package structure as in any one of the preceding examples, wherein the via comprises a plated through hole.

Example 17 includes the microelectronic package substrate as in any one of the preceding examples, further comprising: a microprocessor; a memory; and a battery, wherein at least the microprocessor is electrically coupled to the substrate.

Example 18 is a method of fabricating a microelectronic package assembly, the method comprising: forming an opening in a package substrate, wherein the package substrate comprises a first surface and a second surface; selectively electroplating a magnetic material on at least one surface of the opening; forming a conductive material on the magnetic material; and forming a buildup layer on the magnetic material.

Example 19 includes the method of example 18, wherein the magnetic material comprises a portion of an embedded package inductor.

Example 20 includes the method as in any one of the preceding examples, wherein selectively electroplating the magnetic material comprises electroplating one or more of iron, cobalt, nickel, or molybdenum on the at least one surface of the opening.

Example 21 includes the method as in any one of the preceding examples, wherein selectively electroplating the magnetic material comprises: forming a seed layer on a surface of the opening; and selectively electroplating the magnetic material on the seed layer.

Example 22 includes the method of example 21, wherein forming the seed layer on the surface of the opening comprises forming one or more of copper, titanium, or nickel, and alloys thereof.

Example 23 includes the method as in any one of the preceding examples, wherein forming the opening comprises forming a plated through hole in a core portion of the substrate.

Example 24 includes the method as in any one of the preceding examples wherein selectively electroplating the magnetic material comprises electroplating the magnetic material on a terminal portion of a via structure, wherein the via structure is located within the substrate.

Example 25 includes the method as in any one of the preceding examples wherein selectively electroplating the magnetic material comprises forming the magnetic material in an electroplating bath, wherein the electroplating bath comprises one or more of a permalloy, a supermalloy, nickel, cobalt, iron, molybdenum, sulfates, chlorides and combinations thereof.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A microelectronic package structure, comprising:
a substrate, the substrate having a first side and a second side;
a via extending through the substrate, the via comprising an opening and a sidewall;
a first conductive layer directly on the sidewall of the via and on a top surface of the substrate, adjacent the opening;
a magnetic material directly on the first conductive layer, the magnetic material on the sidewall and over the top surface of the substrate, adjacent to the opening;
a second conductive layer directly on the magnetic material; and
a conductive lid over the opening and over the magnetic material that is on the top surface of the substrate, adjacent the opening, where the magnetic material is not over the opening.

2. The microelectronic package structure of claim 1, wherein the first conductive layer comprises a seed layer, and wherein the seed layer comprises
one or more of copper, titanium, nickel, or alloys thereof.

3. The microelectronic package structure of claim 2, wherein the seed layer comprises a thickness of between about 50 nm to about 5 microns.

4. The microelectronic package structure of claim 1, wherein the substrate comprises an organic substrate.

5. The microelectronic package structure of claim 1, wherein
the magnetic material comprises a portion of an embedded inductor structure.

6. The microelectronic package structure of claim 1, wherein the magnetic material comprises one or more of iron, nickel, cobalt or molybdenum, their alloys, and combinations thereof.

7. The microelectronic package structure of claim 1, wherein
the first side of the substrate includes a die electrically coupled thereto.

8. The microelectronic package structure of claim 7, wherein
the substrate comprises a printed circuit board (PCB), and the die comprises a memory die.

9. The microelectronic package substrate of claim 1, further comprising:
a microprocessor;
a memory; and
a battery, wherein at least the microprocessor is electrically coupled to the substrate.

10. A microelectronic package structure comprising:
a core, wherein the core includes a first side and a second side;
a via extending through the core, the via comprising an opening and a sidewall;
a first conductive layer directly on the sidewall of the via and on a top surface of the core, adjacent the opening;
a magnetic material directly on the first conductive layer, the magnetic material on the sidewall and over the top surface of the core, adjacent to the opening;
a second conductive layer directly on the magnetic material;
a conductive lid over the opening and over the magnetic material that is on the top surface of the core adjacent the opening, where the magnetic material is not over the opening;
and
a buildup layer on at least one of the first side or the second side of the core.

11. The microelectronic package structure of claim 10, wherein the magnetic material comprises an electroplated magnetic material, wherein the electroplated magnetic material comprises one or more of iron, nickel, cobalt, molybdenum, and combinations thereof.

12. The microelectronic package structure of claim 10 wherein at least a portion of one of the first surface or the second surface of the core comprises the magnetic material on the first surface or the second surface.

13. The microelectronic package structure of claim 10, wherein the
magnetic material comprises a thickness of between about 10 microns and about 30 microns.

14. The microelectronic package structure of claim 10, wherein
the via comprises a plated through hole.

15. The microelectronic package structure of claim 10, wherein the magnetic material is not directly on the sidewall of the via.

* * * * *